(12) United States Patent
Tauchi et al.

(10) Patent No.: US 6,524,879 B2
(45) Date of Patent: *Feb. 25, 2003

(54) METHOD FOR PRODUCING A THERMOELECTRIC SEMICONDUCTOR

(75) Inventors: Hitoshi Tauchi, Anjo (JP); Satoru Hori, Nagoya (JP); Hirotsugu Sugiura, Hekinan (JP); Hiroyasu Kojima, Toyota (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 49 days.

This patent is subject to a terminal disclaimer.

(21) Appl. No.: 09/725,570

(22) Filed: Nov. 30, 2000

(65) Prior Publication Data

US 2001/0002319 A1 May 31, 2001

(30) Foreign Application Priority Data

Nov. 30, 1999 (JP) ............................................. 11-341194

(51) Int. Cl.[7] .............................................. H01L 21/00
(52) U.S. Cl. .............................. 438/54; 438/22; 438/46
(58) Field of Search ............................ 438/460, 22, 46, 438/54, 55, 800, 929

(56) References Cited

U.S. PATENT DOCUMENTS 6,222,242 B1 * 5/2001 Konishi et al. .............. 257/467
6,316,279 B1 * 11/2001 Tauchi et al. ................. 438/22

FOREIGN PATENT DOCUMENTS

| JP | 10-178218 | 6/1998 |
| JP | 10-178219 | 6/1998 |
| JP | 11-261119 | 9/1999 |

* cited by examiner

Primary Examiner—Cardad Everhart
(74) Attorney, Agent, or Firm—Oblon, Spivak, McClelland, Maier & Neustadt, P.C.

(57) ABSTRACT

A method for producing a thermoelectric semiconductor includes an ingot production step for producing an ingot of a thermoelectric semiconductor and an integrating step for integrating a plurality of the ingots by plastic deforming the ingots to produce an integrated ingot of the thermoelectric semiconductor. The large size of the thermoelectric semiconductor ingot having uniform performance and mechanical strength can be produced by integration of two or more ingots. Therefore, many wafers can be produce at one time in the slicing step, and productivity is improved. Further, two or more ingots are integrated by plastic deformation so that the connecting strength of the connecting interface is strong.

9 Claims, 10 Drawing Sheets

METHOD FOR PRODUCING A THERMOELECTRIC SEMICONDUCTOR

INCORPORATION BY REFERENCE

The entire disclosure of Japanese Patent Application No. Hei 11-341194 filed on Nov. 30, 1999 including the specification, drawings and abstract is incorporated herein by reference in its entirety.

BACKGROUND OF THE INVENTION

1. Field of the Invention

This invention relates to a method for producing a thermoelectric semiconductor and, more particularly, to a method for producing a thermoelectric semiconductor including plastic deformation of the thermoelectric semiconductor.

2. Description of Related Art

As a thermoelectric semiconductor used for an electric cooling device or a thermoelectric transducer, a material having a hexagonal crystal structure is often used. The thermoelectric semiconductor of such a material is produced as variety of material structures, for example a single crystal structure, a polycrystal structure, a sintering structure, and so on.

The single crystal structure shows high performance (hereinafter referred as "Figure of Merit") due to complete crystal orientation. However, the material of a single crystal structure has a low mechanical strength and is fragile, due to existence of cleavage planes (hereinafter referred as "c-planes") arranged in parallel to the crystal structure. The material having a polycrystal structure, which is produced by a one directional solidified method such as the Bridgeman method, has a moderate performance and moderate mechanical strength. The material of a sintering structure, which is produced by sintering crystal powders, has a low performance but shows high mechanical strength. One of these materials is selected with consideration of the using environment, condition and so on.

The thermoelectric semiconductor is produced as an ingot of the thermoelectric semiconductor material. The ingot is sliced to form wafers. A wafer is diced to form a thermoelectric semiconductor chip (i.e. a thermoelectric semiconductor element). In view of the mass-production, it is more efficient to slice a large ingot to make many wafers at one time, rather then to slice a small ingot. However, the large ingot has variations in performance because the temperature dispersion and pressure dispersion are large at the ingot production step. On the contrary, the small ingot has a uniform performance, but the small ingot causes a reduction of productivity.

SUMMARY OF THE INVENTION

Accordingly, an object of this invention is to solve above conventional problems.

Further, another object of this invention is to produce a large ingot of the electric semiconductor having uniform performance in any portion therein.

According to a feature of the invention, the above and other objects are achieved by a method for producing a thermoelectric semiconductor, which includes an ingot producing step for producing an ingot of the thermoelectric semiconductor, and an integrating step for integrating a plurality of the ingots by plastic deformation so as to produce an integrated ingot for the thermoelectric semiconductor.

The advantages of the aforementioned features of this invention include the feature that a plurality of ingots are integrated to form an integrated ingot in the integrating step. Therefore, the ingot becomes large by the integrating step and many wafers can be produced at one time in the slicing step so that the productivity is improved. Further, the connecting strength at the connecting interface is strengthened by the plastic deformation and therefore the mechanical strength of the integrated ingot is improved. Furthermore, orientation of the C-planes in the sintered semiconductor material is improved by the plastic deformation and therefore the thermoelectric performance (Figure of Merit) is also improved.

BRIEF DESCRIPTION OF THE DRAWINGS

These and other objects and features of the invention will be more apparent and more readily appreciated from the following detailed description of some preferred embodiments of the invention with the accompanying drawings, in which.

DESCRIPTION OF THE PREFERRED EMBODIMENTS

Embodiments of this invention is herein described in detail referring to accompanying drawings.

First Embodiment

In this embodiment, the thermoelectric semiconductor element is produced by several steps as follows:

(1) crystal alloy production step
(2) powdering step
(3) pre-pressing step
(4) sintering step
(5) integrating step In the above steps, the (1) crystal alloy production step, (2) powdering step, (3) pre-pressing step and (4) sintering step together correspond to an ingot production step for producing an ingot of the thermoelectric semiconductor of the present invention. Hereinafter, each of the steps is explained in detail.

(1) Crystal Alloy Production Step

First, material powders of Bismuth (Bi), Tellurium (Te), Antimony (Sb), each of which has a purity of 3N (three nine: 99.9%), are measured and mixed so as to be able to form a chemical structure of $Bi_{0.5}Sb_{1.5}Te_3$. The mixed material powders are put in a quartz glass tube. Then, powder of Silver (Ag) is added to the material powders as an additive by 0.01 weight percent (wt. %). After that, the quartz glass tube is evacuated by a vacuum pump to decrease a pressure therein to less than 13.3 Pa (0.1 torr) and hermetically sealed after vacuuming. After sealing, the quartz glass tube is swung for one hour at a temperature of 700° C. in order to resolve and stir the mixed material powder. After that, the quartz glass tube is cooled for re-crystallization to produce a crystal alloy.

(2) Powdering Step

The crystal alloy produced by previous step (crystal alloy production step) is cut by a cutter mill to obtain a crystal alloy powder. After that, the crystal alloy powder is sifted to obtain a powder that has particles with a diameter of less than 90 μm.

(3) Pre-pressing Step

Figure 1:
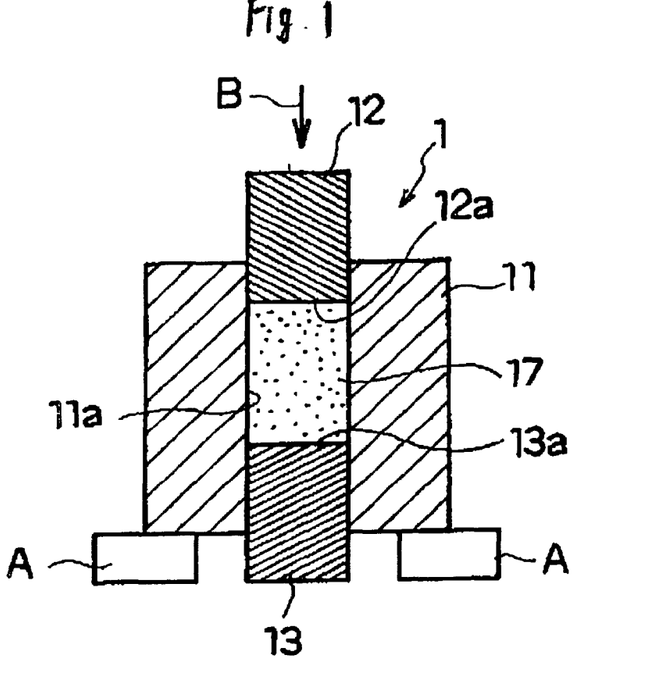
FIG. 1 is a cross sectional schematic view of a molding device used at a pre-pressing step in the first embodiment.

In this step, the powder having particles with a diameter less than 90 μm, which is obtained in the previous step (powdering step), is pre-pressed. FIG. 1 is a cross-sectional schematic view of a molding device for performing this step. As shown in FIG. 1, the molding device 1 has a die 11, an upper punch 12 and a lower punch 13. The die 11 is cylindrical in shape, and a penetration hole 11a is formed from the upper surface to the lower surface at a center portion of the die 11. The upper punch 12 is inserted into the penetration hole 11a from the upper side of the die 11, and the lower punch 13 is inserted into the penetration hole 11a from the lower side of the die 11. A cavity 17 is closed by a lower surface 12a of the upper punch 12, an upper surface 13a of the lower punch 13 and an inner surface of the penetration hole 11a.

Figure 2:
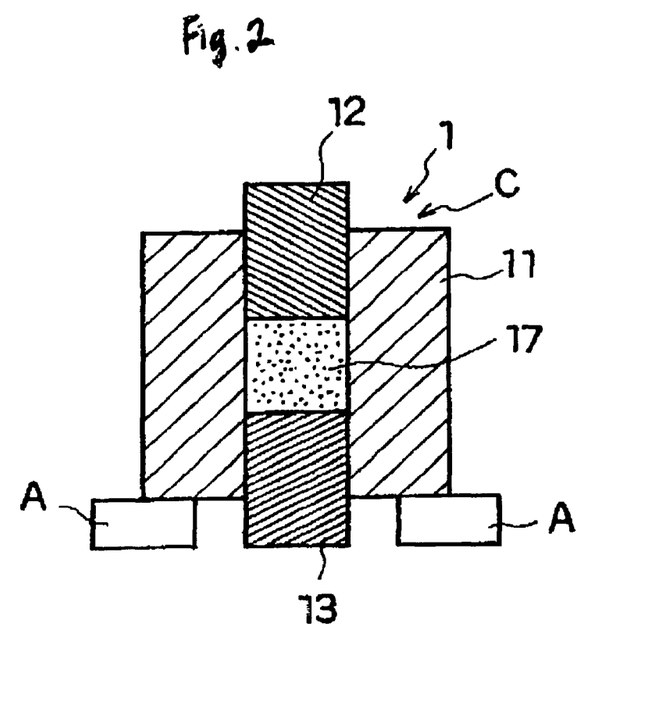
FIG. 2 is a cross sectional schematic view of a molding device used at the pre-pressing step in the first embodiment, which shows the pressing condition.

As shown in FIG. 1, the molding device 1 having the structure described above is set on a spacer A, and then the cavity 17 is filled with the powder which is obtained in the previous step (powdering step) and has a diameter of less than 90 μm. After that, by using a hand pressing device, the upper, punch 12 is pushed down along a vertical direction shown by an arrow B in the FIG. 1. The powder in the cavity 17 is thus pressed as shown in FIG. 2.

In this step the die 11, the upper punch 12 and the lower punch 13 are integrated by the powder and friction in the cavity 17. Hereinafter, the integrated unit of the die 11, the upper punch 12 and the lower punch 13 are referred as the unit C.

(4) Sintering Step

Figure 3:
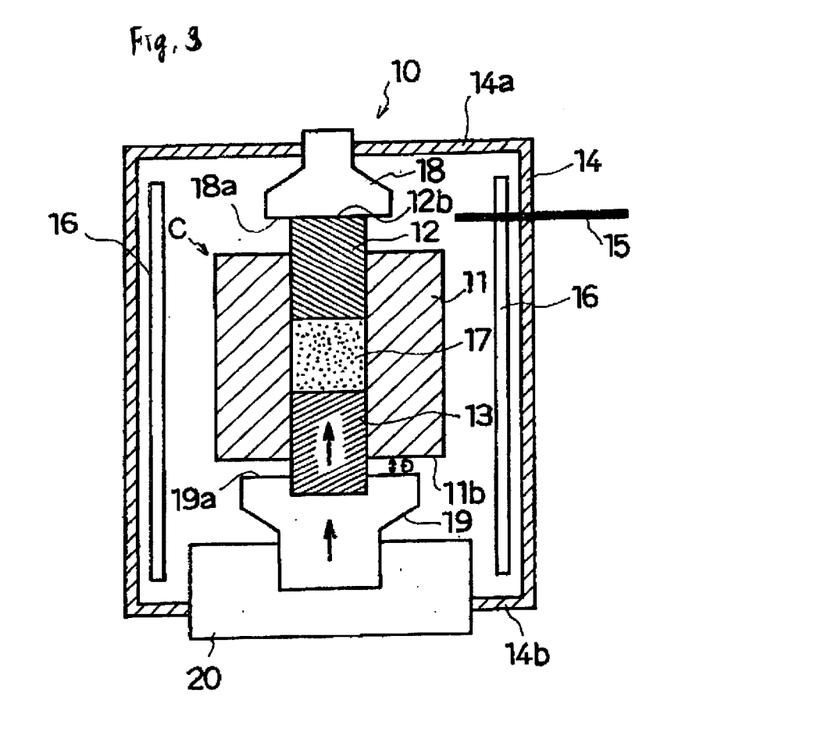
FIG. 3 is a cross sectional schematic view of a sintering apparatus in the first embodiment which shows a lower punch pressing condition in the sintering step.

The unit C which is integrated at the previous step (pre-pressing step) is set in the sintering apparatus and a sintering process is performed. FIG. 3 is a cross sectional schematic view of the sintering apparatus. As shown in FIG. 3, the sintering apparatus 10 has a housing 14. An electric heater 16 is disposed inside the housing 14. A thermocouple 15 is provided in the housing 14 to detect the temperature in the housing 14. An upper spacer 18 is fixed to an upper wall 14a of the housing 14. A hydraulic cylinder 20 is provided at a bottom portion of the housing 14. A cylinder rod (not shown) of the cylinder 20 is connected to a lower spacer 19. The unit C is set between the upper spacer 18 and the lower spacer 19. As shown in FIG. 3, a lower surface of the lower punch 13 in the unit C is set in a concave portion formed on an upper surface 19a of the lower spacer 19, and an upper surface 12b of the upper punch 12 contacts a lower surface 18a of the upper spacer 18. It is noted that a gap D is formed between a lower surface 18a of the die 11 and upper surface 19a of the lower spacer 19. In this state, the die 11 does not drop due to its weight and the gap D remains, because the die 11 is supported by the powder and friction in the cavity 17.

The operation of the sintering apparatus described above is explained below.

First, air in the housing 14 is replaced by inert gas (nitrogen gas). Then, the electric heater 16 is powered on to heat interior of the housing 14. At the time when the temperature reaches 400° C. in the housing 14, the hydraulic cylinder 20 is driven so that the lower punch 13 moves upward. Therefore, the powder in the cavity 17 is pressed at the pressure of 39.2 MPa (400 kg/cm$^2$). In this embodiment, this pressing process has two sub-processes: (a) a lower punch pressing sub-process and (b) an upper punch pressing sub-process.

(a) lower punch pressing sub-process

When hydraulic cylinder 20 elevates the cylinder rod (not shown) upward, the lower spacer 19 connected to the cylinder rod moves upward so that the lower punch 13 contacted to the lower spacer 19 moves upward. However, the die 11 and the upper punch 12 do not move. Accordingly, in this sub-process, the lower punch 13 presses the powder in the cavity 17 from the lower side. Therefore, the gap D is decreased between the lower surface 11b of the die 11 and the upper surface area of the lower spacer 19 due to the upward movement of the lower spacer 19. The lower punch pressing sub-process continues until the gap D disappears.

(b) upper punch pressing sub-process

Figure 4:
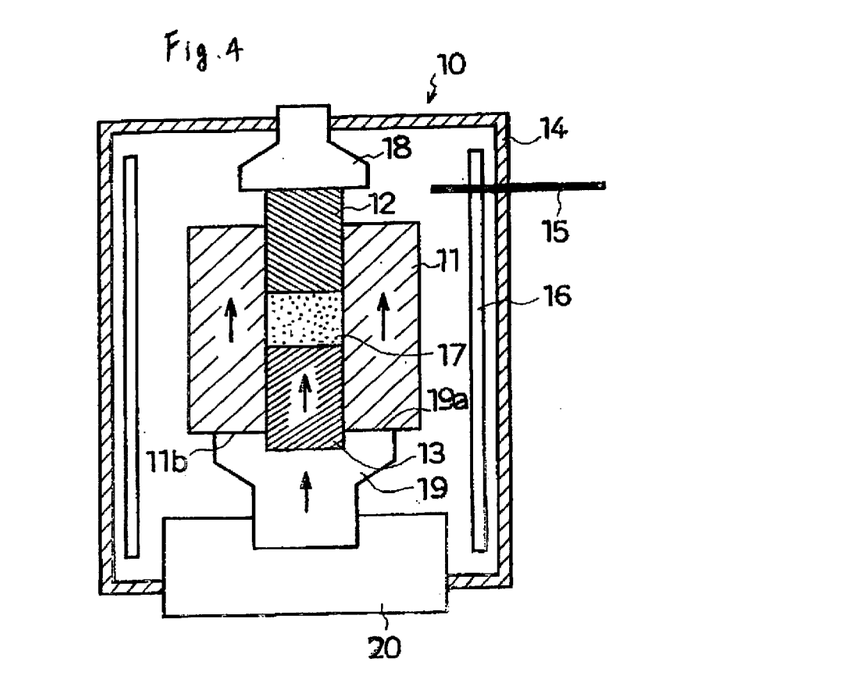
FIG. 4 is a cross sectional schematic view of a sintering apparatus in the first embodiment which shows an upper punch pressing condition.

In lower punch pressing sub-process, the gap D gets narrower according to the upward movement of the lower spacer 19, and finally the upper surface 19a of the lower spacer 19 contacts the lower surface 11b of the die 11 so that the gap D disappears as shown in FIG. 4. In this condition, driving force from the lower spacer 19 connected to the cylinder rod of the cylinder 20 is transferred not only to the lower punch 13 but also to the die 11 directly so that the lower punch 13 and the die 11 move upward together. However, the upper punch 12 does not move because it engages the fixed upper spacer 18. At this state, the stationary upper punch 12 relatively moves into the moving die 11 so that the upper punch 12 presses the powder in the cavity 17. Therefore, the powder in the cavity 17 is pressed by the upper punch 12 from above.

Figure 5:
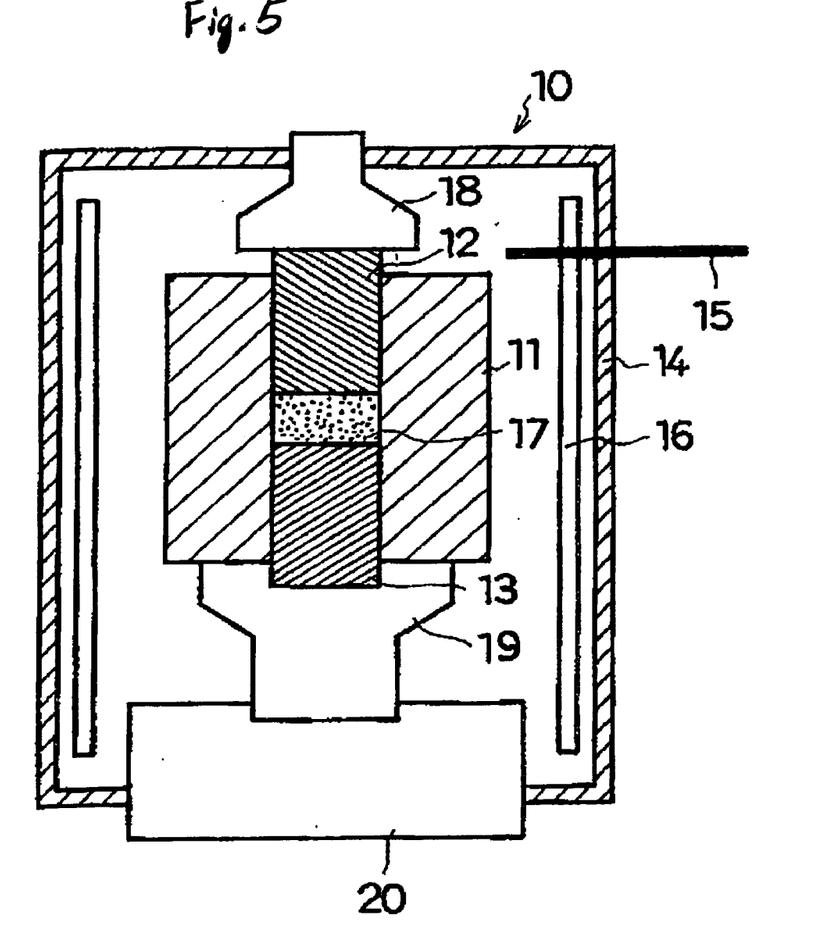
FIG. 5 is a cross sectional schematic view of a sintering apparatus in the first embodiment which shows the final condition in the sintering step.
Figure 6:
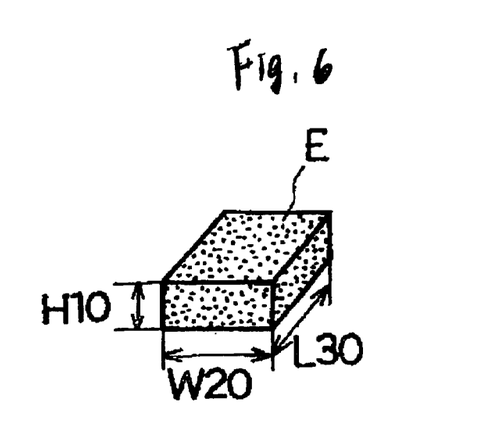
FIG. 6 is a perspective view of a sintered ingot produced by the sintering step in the first embodiment.

FIG. 5 is a cross-sectional schematic view of the sintering apparatus 10 which shows the final process of the sintering step. In this process, the powder in the cavity 17 is sintered to produce an sintered ingot. The produced sintered ingot has an exemplary size of 10 mm in height, 20 mm in width, and 30 mm in length, as shown in FIG. 6.

(5) Integrating Step

Figure 7:
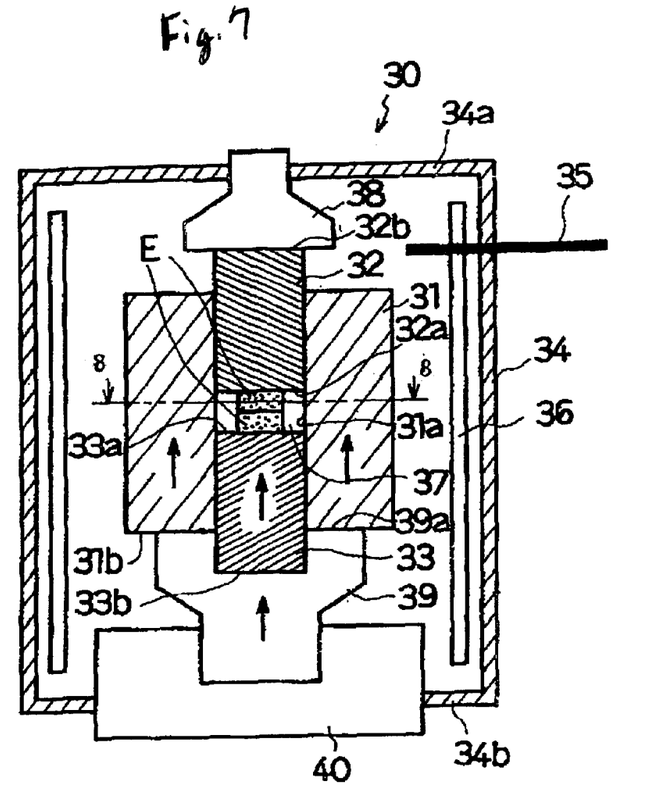
FIG. 7 is a cross sectional schematic view of a plastic deformation apparatus in the first embodiment.

FIG. 7 is a cross sectional schematic view of a plastic deformation apparatus for use in the integrating step. As shown in FIG. 7, the plastic deformation apparatus 30 has a die 31, an upper punch 32 and a lower punch 33. The cross sectional shape of the die 31 is rectangular, and a penetration hole 31a is formed from the upper surface to the lower surface at the center portion of the die 31. The upper punch 32 is inserted into the penetration hole 31a from the upper side of the die 31, and the lower punch 33 is inserted into the penetration hole 31a from the lower side of the die 31. A cavity 37 is closed by a lower surface 32a of the upper punch 32, an upper surface 33a of the lower punch 33 and an inner surface of the penetration hole 31a. Two pieces of the sintered ingots E which are produced in the sintering step and have a size of 10 mm in height, 20 mm in width and 30 mm in length are stacked in series in the cavity 37 as shown in FIG. 7.

Figure 8:
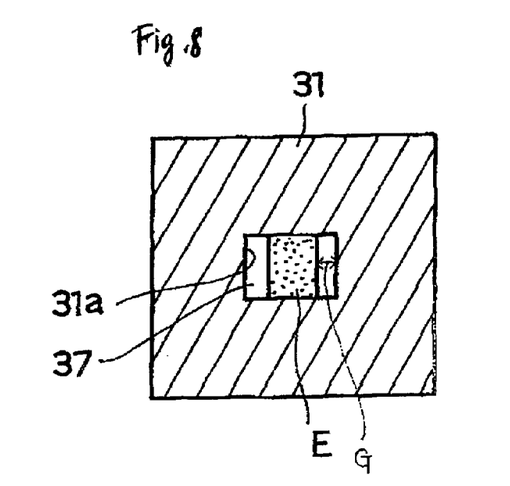
FIG. 8 is a cross sectional view taken along line 8—8 in FIG. 7.

FIG. 8 is a cross-sectional view taken along line 8—8 in FIG. 7. As shown in FIG. 8, the widths of the ingots E are smaller than that of the cavity 37, so as to form a gap G between surfaces of the ingots E and inner surfaces 31a of the die 31.

The die 31, the upper punch 32 and the lower punch 33 are disposed in a housing 34 as shown in FIG. 7. An upper spacer 38 is fixed at an upper wall 34a of the housing 34. An upper surface 32b of the upper punch 32 contacts to the upper spacer 38. A hydraulic cylinder 40 is provided at a bottom portion of the housing 34. A cylinder rod (not shown) of the cylinder 40 is connected to a lower spacer 39. A lower surface 33b of the lower punch 33 is set in a concave portion formed on an upper surface 39a of the lower spacer 39.

An electric heater 36 is disposed at an inner side wall of the housing 34. A thermocouple 35 is provided in the housing 34 to detect the temperature in the housing 34.

As described above, the structure of the plastic deformation apparatus 30 shown in FIG. 7 is almost the same as that of the sintering apparatus 10 shown in FIG. 3. However, it is noted that the upper surface 39a of the lower spacer 39 contacts a lower surface 31b of the die 31 in the plastic deformation apparatus 30 in FIG. 7, whereas the upper surface of the lower spacer 19 does not contact the lower surface 11b of the die 11 due to the gap D in the sintering apparatus 10 in FIG. 3. Also, when the sintered body E is set in the cavity 37, there is no friction force applied between the sintered body E and the die 37 because the sintered body E and the die 31 are not integrated, unlike the unit C in FIG. 3. Therefore, no gap exists in the plastic deformation apparatus 30, unlike the sintering apparatus 10. However, a similar gap may be formed between the die 31 and the lower spacer 39 by inserting a spacer between the lower surface 31b of the die 31 and the upper surface 39a of the lower spacer 39.

The operation of the plastic deformation apparatus 30 is explained below.

First, air in the housing 34 is replaced by inert gas (nitrogen gas). Then, the electric heater 36 is powered on to heat the interior of the housing 34. At the time when the temperature detected by the thermocouple 35 reaches a desired temperature in the housing 34 (in this specification, the desired temperature is called "plastic deformation temperature T"), the hydraulic cylinder 40 is driven so that the lower spacer 39 moves upward. The driving force from the lower spacer 39 is transferred to the lower punch 33 and the die 31 so that the lower punch 33 and the die 31 move upward together. However, the upper punch 32 does not move because it engages the upper side spacer 38. At this state, the stationary upper punch 32 relatively moves into the moving die 31 so that the upper punch 32 presses the ingots E in the cavity 37. Therefore, the ingots E in the cavity 37 are pressed by the upper punch 32 from above.

Figure 9:
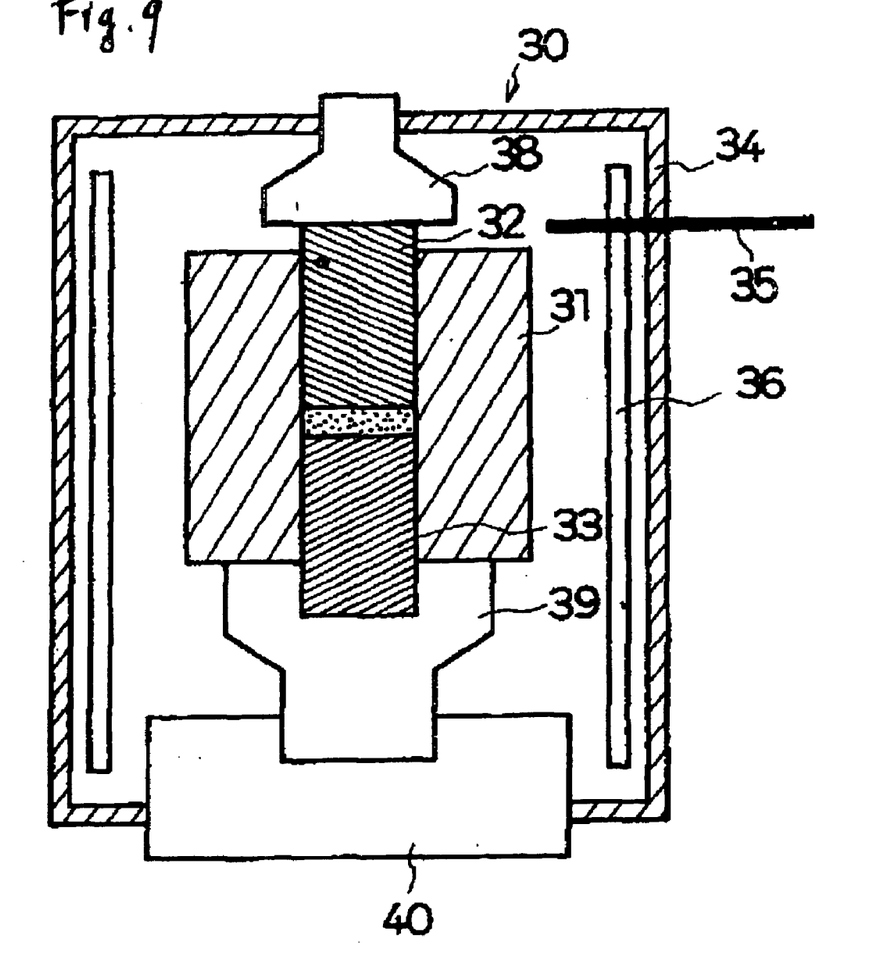
FIG. 9 is a cross-sectional schematic view of a plastic deformation apparatus in the first embodiment which shows a final condition in an integrating step.
Figure 10:
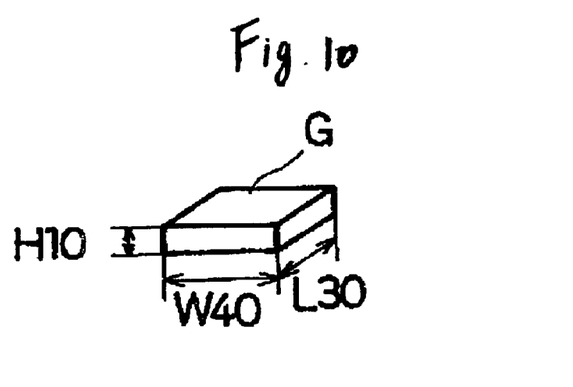
FIG. 10 is a perspective view of a sintered ingot produced by the integrating step in the first embodiment.

The above described plastic deformation process continues for a desired period of time. FIG. 9 is a cross-sectional schematic view of the plastic deformation apparatus 30 which shows final condition of the integrating step. In the final condition, the two pieces of sintered ingots E are completely deformed to form an integrated ingot which fills the gap G in the cavity 37. After that, the integrated ingot is ejected from the plastic deformation apparatus 30. FIG. 10 is a perspective view of an integrated ingot produced in the integrated step. As shown in FIG. 10, the exemplary produced integrated ingot G has a size of 10 mm in height, 40 mm in width, and 30 mm in length. The size of the integrated ingot G is larger than the size of the ingot E produced in the sintering step shown in FIG. 6 (10 mm in height, 20 mm in width, 30 mm in length).

In this embodiment, the plastic deformation temperature T is selected as 350° C., 450° C. or 550° C., respectively, and the plastic deformation time is selected as 5 minutes, 10 minutes or 30 minutes, respectively. The integrated ingots G are produced under these temperature conditions and these deformation times.

Seebeck coefficient α, electric conductivity σ are measured with respect to each integrated sintered ingot G, and a figure of merit Z is calculated as follows:

$$\text{figure of merit } Z = \alpha^2 \times \sigma / \kappa,$$

wherein κ is heat conductivity.

Figure 11:
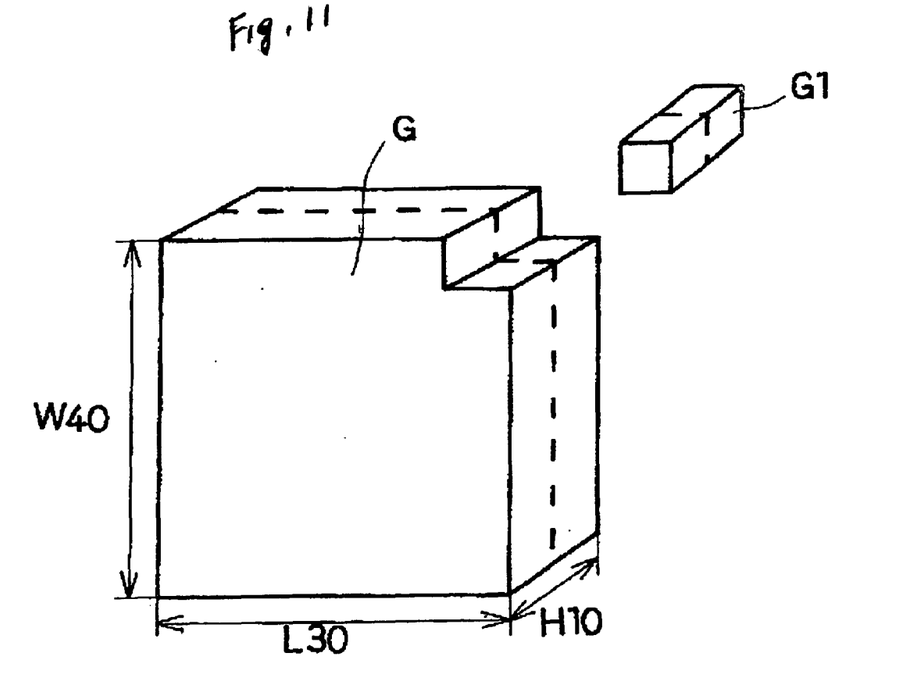
FIG. 11 is a perspective view of a sintered body G and test piece G1 quarried from the sintered body G. which shows how to quarry the test piece G1 from the sintered body G in the first embodiment.

Further, a test piece G1 is quarried from the integrated sintered ingot G and a bending strength of the test piece G1 is also measured. It is noted that the test piece G1 is quarried so as to include a boundary interface of the two pieces which form the sintered ingot E.

Measurement and calculation results are shown in Table 1 with the various plastic deformation temperature conditions and the plastic deformation times.

Comparative Embodiment

A crystal alloy is produced by the crystal alloy production step as described in the first embodiment. After that, the crystal alloy is powdered by the powdering step, as also described in the first embodiment. The crystal alloy powder is filled in the cavity of the pre-pressing device as shown in FIG. 1, and the unit C as shown in FIG. 2 is formed. The body C is set in the sintering apparatus as shown in FIG. 3, and the powder is sintered by the sintering step in the first embodiment. In the sintering step, the temperature, the sintering pressure and sintering time are set to 400° C., 39.2 MPa (400 kg/cm²) and 30 minutes. By the sintering step, a sintered ingot is produced which has a size of 20 mm in height, 20 mm in width, and 30 mm in length.

The sintered ingot produced in the comparative embodiment is set in the cavity of the plastic deformation apparatus as shown in FIG. 7. It is noted that only one sintered ingot is set in the cavity in the comparative embodiment, whereas two sintered ingots are set in the cavity in the first embodiment. In the plastic deformation step, the plastic deforming temperature, pressure and time are set to 350° C., 19.6 MPa (200 kg/cm$^2$) and 30 minutes. By this step, a deformed sintered ingot having a size of 10 mm in height, 40 mm in width, and 30 mm in length is produced.

Seebeck coefficient a and electric conductivity σ are measured with respect to the sintered body produced as above, and figure of merit Z is calculated.

Figure 12:
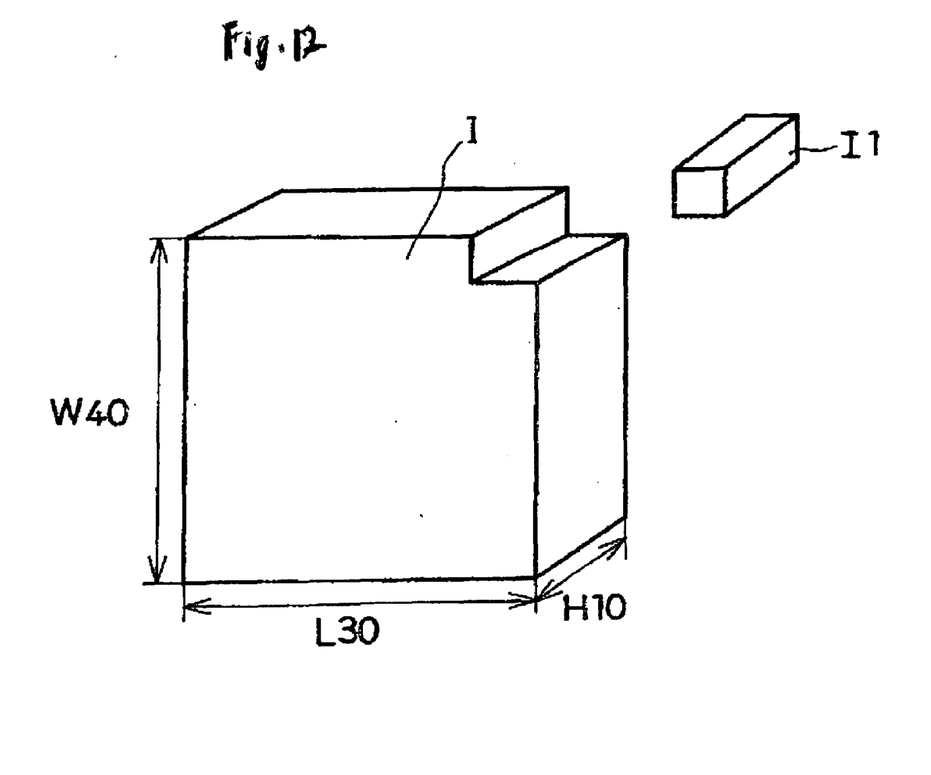
FIG. 12 is a perspective view of a sintered body and a test piece of a comparative embodiment.

Further, a test piece I1 is quarried from the sintered body I and a bending strength is measured using the test piece I1 as shown in FIG. 12.

A measurement and calculation results are shown in Table 1 with the plastic deformation temperature conditions and the plastic deformation times.

Second Embodiment

In this embodiment, the thermoelectric semiconductor element is produced by undergoing several steps as follows:

(1) crystal alloy production step (2) powdering step (3) pressing step (4) extruding step (5) integrating step wherein an ingot production step for producing an ingot of the thermoelectric semiconductor comprises the (1) crystal alloy production step, (2) powdering step, (3) pressing step and (4) extruding step.

In the above steps, (1) the crystal alloy production step, (2) the powdering step are identical with the first embodiment. Therefore, detailed description of these steps are omitted. Hereinafter, the rest of the (3) pressing step, (4) extruding step and (5) integrated step are explained.

(3) Pressing Step

In this step, the powder having particles with a diameter less than 90 μm, which is obtained in the previous step (powdering step), is pressed at 68.6 MPa (700 kg/cm$^2$) by a mold to form a pressed body.

(4) Extruding Step

Figure 13:
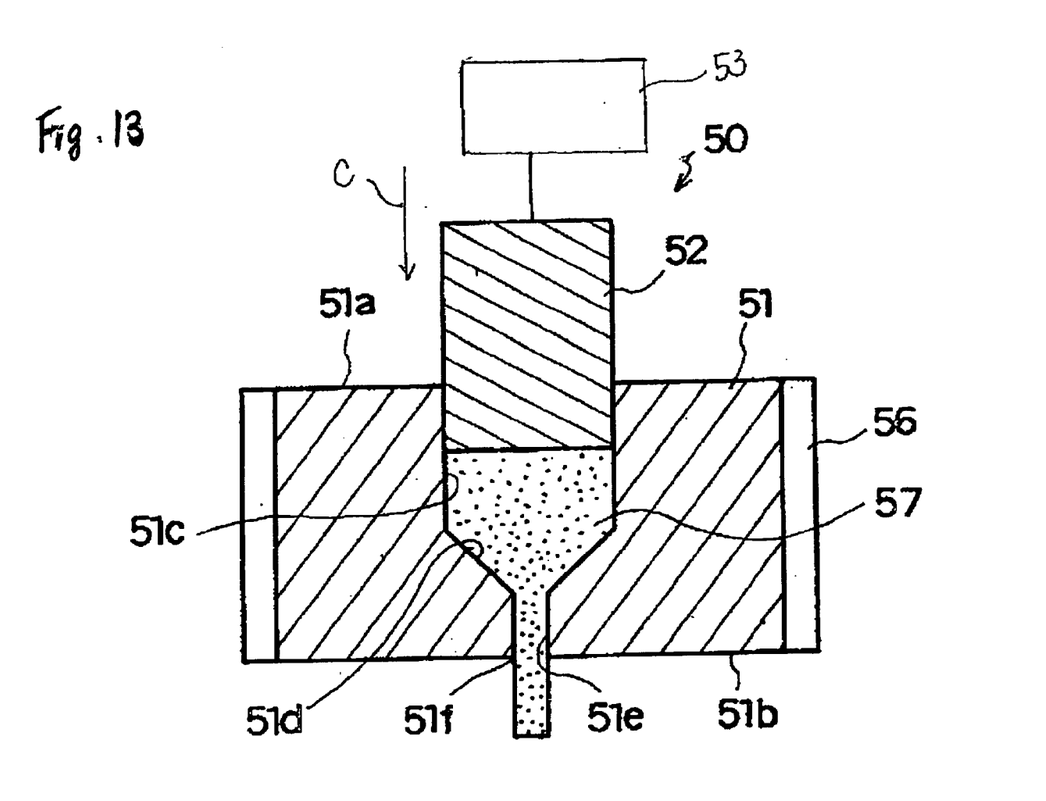
FIG. 13 is a cross sectional schematic view of a sintering apparatus extruded in a second embodiment.

The pressed body pressed in the previous step (pressing step) is set in the extrusion apparatus to perform the extruding process. FIG. 13 is a cross sectional schematic view of the extrusion apparatus. As shown in FIG. 13, the extrusion apparatus 50 has a die 51, a punch 52 and a hydraulic cylinder 53. The die 51 is shaped cylindrically and a penetration hole is formed at a center portion of the die 51. The penetration hole comprises a large diameter part 51c, a small diameter part 51e, and a taper part 51d. The large diameter part 51c opens at the end surface 51a of the die 51. The small diameter pert 51e has a diameter which is smaller than that of the large diameter part 51c and opens at the other end surface 51b of the die 51. The taper part 51d is provided between the large diameter part 51c and the small diameter part 51e and has a conical surface for connecting the large diameter pert 51c with the small diameter part 51e. A cavity 57 is formed by the large diameter part 51c, the taper part 51d and the small diameter part 51e. The punch 52 has a column shape with the same diameter as the large diameter part 51c of the penetration hole. The punch 52 is inserted in the large diameter part 51c. The hydraulic cylinder 53 is connected to the punch 52. The hydraulic cylinder 53 is used for applying a driving force to the punch 52. A ring heater 56 is provided around the side wall of the die 51.

The operation of the extrusion apparatus described above is explained below.

First, the pressed body produced in the pressing step is disposed in the cavity 57. Then, the ring heater 56 is powered on to heat the die 51. When the temperature of the die 51 reaches 470° C., the punch 52 is inserted in the large diameter part 51c, and the hydraulic cylinder 53 is driven to move the punch 52 in the direction shown in arrow C in FIG. 13. The pressed body in the cavity 57 is pressed so that the powder which forms the pressed body flows into the small diameter part 51e. During the flow into the small diameter part 51e, the powder is sintered due to applied pressure of 1.67 MPa (170 kg/mm$^2$) under a temperature of 470° C. Then the sintered ingot is extruded out from the exhaust port 51f of the die 51, to produce a sintered ingot having a diameter of 1.2 mm. In this embodiment, an extruding rate of the sintered ingot extruded from the exhaust port 51f is 4 mm/sec.

Figure 14:
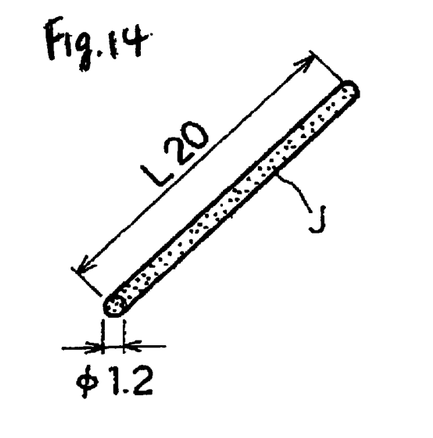
FIG. 14 is a perspective view of a sintered ingot produced by a sintering step in the second embodiment.

The sintered ingot is cut to produce the sintered ingot J which has an exemplary size of 20 mm in length and 1.2 mm in diameter, as shown in FIG. 14.

(5) Integrating Step

Figure 15:
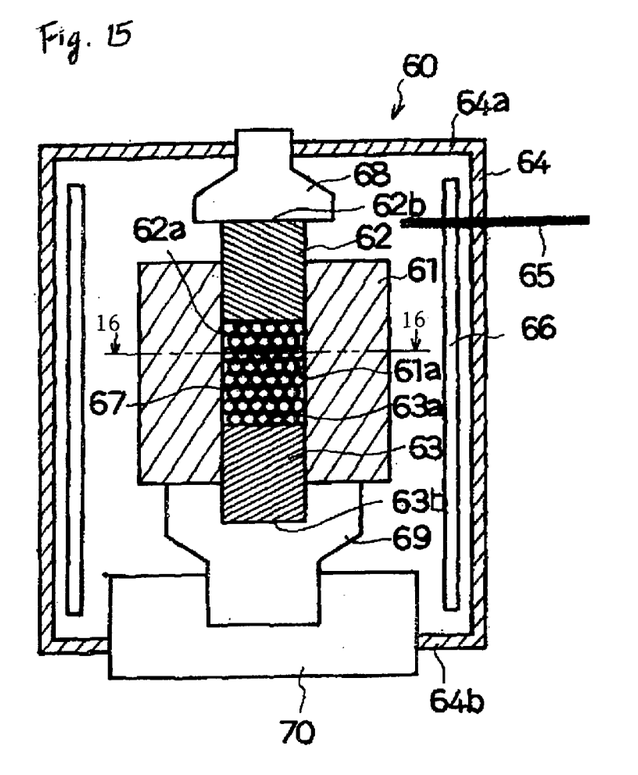
FIG. 15 is a cross sectional schematic view of a plastic deformation apparatus in the second embodiment.

A plurality of the sintered ingots J produced in the extruding step are prepared for integration by plastic deformation. FIG. 15 is a cross sectional schematic view of a plastic deformation apparatus for the integrating process. As shown in FIG. 15, the plastic deformation apparatus 60 has a die 61, an upper punch 62 and a lower punch 63. The die 61 is shaped rectangular, and a penetration hole 61a is formed from the upper surface to the lower surface at the center portion of the die 61. The upper punch 62 is inserted into the penetration hole 61a from the upper side of the die 61, and the lower punch 63 is inserted into the penetration hole 61a from the lower side of the die 61. A cavity 67 is closed by a lower surface 62a of the upper punch 62, an upper surface 63a of the lower punch 63 and an inner surface of the penetration hole 61a.

The die 61, the upper punch 62 and the lower punch 63 are disposed in a housing 64. An upper spacer 68 is fixed at an upper wall 64a of the housing 64. An upper surface 62b of the upper punch 62 is connected to the upper spacer 68. A hydraulic cylinder 70 is provided at a bottom portion of the housing 64. A cylinder rod (not shown) of the cylinder 70 is connected to a lower spacer 69. A lower surface 63b of the lower punch 63 is set on a concave portion formed on the upper surface of the lower spacer 69.

Figure 16:
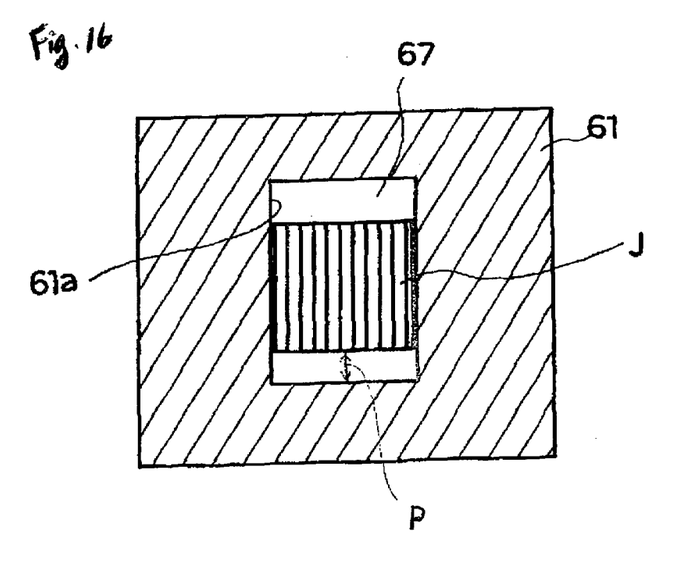
FIG. 16 is a cross sectional view taken along line 16—16 in FIG. 15.

An electric heater 66 is disposed at an inner side wall of the housing 64. A thermocouple 65 is provided in the housing 64 to detect the temperature in the housing 64. A plurality of the sintered ingots produced in the extruding step are disposed in the cavity 67. FIG. 16 is a cross sectional view taken along line 16—16 in FIG. 15. As shown in FIG. 16, the sintered ingots are arranged in the cavity 67 so as to be in parallel to one another. Further as shown in FIG. 16, a gap P remains between both ends of the sintered ingots and the inner surface of the die 61.

An operation step of the plastic deformation apparatus 60 described above is explained below.

First, air in the housing 64 is replaced by inert gas (nitrogen gas). Then, the electric heater 66 is powered on to heat interior of the housing 64. At the time when the temperature detected by the thermocouple 65 reaches the plastic deformation temperature T, the hydraulic cylinder 70 is driven so that the lower spacer 69 moves upward. The driving force from the lower spacer 69 is transferred to the lower punch 63 and the die 61 so that the lower punch 63 and the die 61 move upward together. However, the upper punch 62 does not move because it engages the upper side spacer 68. In this state, the stationary upper punch 62 relatively moves into the moving die 61 so that the upper punch 62 presses the sintered ingots in the cavity 67. Therefore, the sintered ingots in the cavity 67 are pressed by the upper punch 62 from above. In this step, a pressure of 19.6 MPa (200 kg/cm²) is applied to the sintered ingots.

Figure 17:
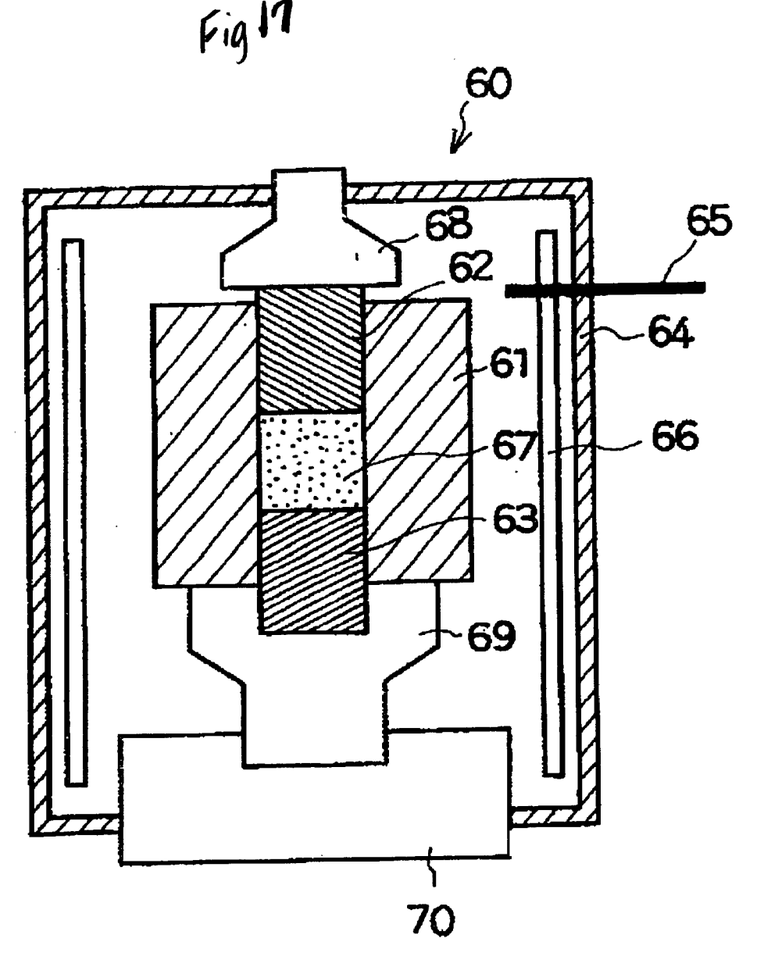
FIG. 17 is a cross sectional schematic view of a plastic deformation apparatus in the second embodiment, which shows a final condition of the integrating step.

FIG. 17 is a cross sectional schematic view of the plastic deformation apparatus 60 which shows the final condition of the integrating step. In this condition, a plurality of the sintered ingots J are completely deformed to form an integrated ingot which fills the gap P in the cavity 67. After that, the integrated ingot is ejected from the plastic deformation apparatus 60.

Figure 18:
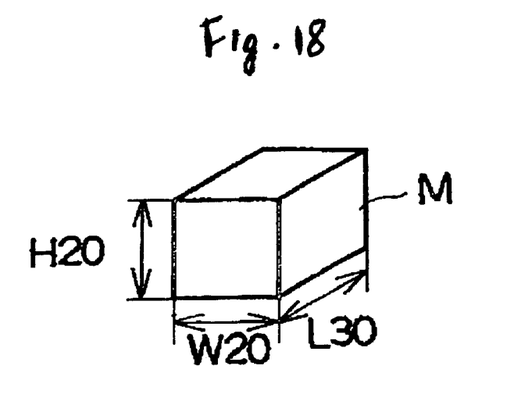
FIG. 18 is a perspective view of a sintered ingot produced by the integrating step in the second embodiment.

FIG. 18 is a perspective view of an integrated ingot produced in the integrated step. As shown in FIG. 18, the produced integrated ingot M has an exemplary size of 20 mm in height, 20 mm in width and 30 mm in length. The size of the integrated ingot M shown in FIG. 18 is larger than the size of the ingot J produced in the extruding step shown in FIG. 14 (20 mm length, 1.2 mm diameter).

In this embodiment, the plastic deformation temperature T is selected as 350° C., 450° C., or 550° C., and the plastic deformation time is selected as 5 minutes, 10 minutes or 30 minutes, respectively. The integrated sintered ingot is produced under these temperature conditions and these deformation times, respectively.

Seebeck coefficient $\alpha$ and electric conductivity $\sigma$ are measured with respect to each integrated sintered ingot produced, and a figure of merit Z is calculated.

Figure 19:
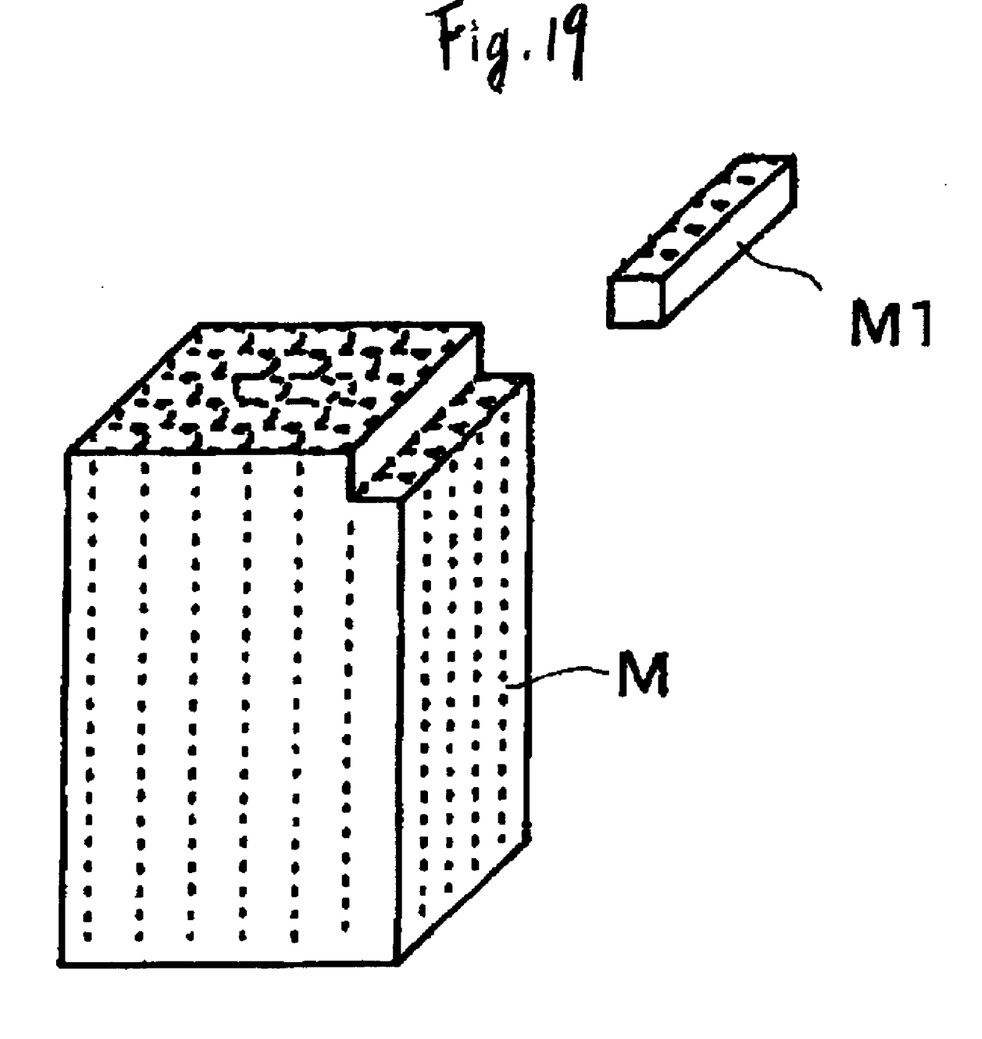
FIG. 19 is a perspective view of a sintered body M and test piece M1 quarried from the sintered body M, which shows how to quarry the test piece M1 from the sintered body M in the second embodiment.

Further, a test piece M1 is quarried from the integrated sintered ingot M and a bending strength of the test piece M1 is measured. It is noted that the test piece M1 is quarried so as to include a boundary interface among the sintered ingots J.

Measurement and calculation results are shown in Table 1 with various plastic deformation temperature conditions and the plastic deformation times.

TABLE 1

| | plastic deformation condition | | electric performance | | | bending strength | |
|---|---|---|---|---|---|---|---|
| | T | t | $\alpha$ | $\sigma$ | Z | (kg/mm²) | crack |
| first embodiment | 350 | 5 | 199.5 | 1137 | 3.08 | 1.7 | X |
| | | 10 | 201.4 | 1112 | 3.09 | 4.7 | ○ |
| | | 30 | 201.2 | 1108 | 3.08 | 6.1 | ○ |
| | 450 | 5 | 195.1 | 1209 | 3.06 | 2.3 | X |
| | | 10 | 201.8 | 1122 | 3.13 | 5.2 | ○ |
| | | 30 | 196.9 | 1204 | 3.11 | 5.5 | ○ |
| | 550 | 5 | 198.8 | 1164 | 3.11 | 2.2 | X |
| | | 10 | 198.3 | 1167 | 3.10 | 5.6 | ○ |
| | | 30 | 200.8 | 1111 | 3.08 | 6.0 | ○ |
| second embodiment | 350 | 5 | 199.2 | 1145 | 3.09 | 0.9 | X |
| | | 10 | 198.7 | 1145 | 3.07 | 3.1 | ○ |
| | | 30 | 198.7 | 1169 | 3.11 | 3.3 | ○ |
| | 450 | 5 | 198.3 | 1176 | 3.11 | 1.4 | X |
| | | 10 | 197.9 | 1162 | 3.07 | 3.6 | ○ |
| | | 30 | 201.2 | 1112 | 3.09 | 4.2 | ○ |
| | 550 | 5 | 199.7 | 1138 | 3.09 | 2.2 | X |
| | | 10 | 200.1 | 1133 | 3.09 | 4.0 | ○ |
| | | 30 | 201.2 | 1122 | 3.11 | 5.5 | ○ |
| comparative embodiment | 350 | 30 | 200.3 | 1126 | 3.09 | 6.3 | ○ |

In Table 1, T represents the plastic deformation temperature (° C.). Further, t represents the plastic deformation time (minutes), $\alpha$ represents measured Seebeck coefficient (uV/K). $\sigma$ represents measured electrical conductivity ($10^2/\Omega$m). In addition, Z represents calculated Figure of Merit ($10^{-3}$/K). Further, "crack" in Table 1 means a crack generation in the test piece M1, G1, I1 when quarrying the test piece M1, G1, I1 from the integrated sintered ingot M, and plastic deformed ingot I. The sign "○" shows no crack generation and the sign "x" shows the crack generation.

As shown in Table 1, the Figure of Merit Z of the first embodiment and the second embodiment are almost equal to the Figure of Merit of the comparative embodiment. Accordingly, it is proved that electrical performance is not deteriorated due to integration of two or more sintered ingots in the first and the second embodiments.

Further, in the first and the second embodiments, the bending strength is higher when the plastic deformation times are set for 10 minutes and 30 minutes, whereas the bending strength is lower when the plastic deformation time is set for 5 minutes. This means that the connecting strength at the connecting interface is insufficient when the plastic deformation time is as short as 5 minutes. Further, when the plastic deformation time is set for 5 minutes, a crack is generated in the test piece after quarrying from the integrated sintered ingot due to the low connecting strength of the connecting interface.

As shown in Table 1 and the above description, the thermoelectric semiconductors produced by the first and the second embodiments have good performance and a good mechanical strength (bending strength). Especially, when the plastic deformation time is set for more than 10 minutes in the first and the second embodiments, the thermoelectric semiconductor produced is not inferior to the comparative embodiment with respect to performance (Figure of Merit) and mechanical strength. However, in the case of the comparative embodiment, a variation of the performance and the mechanical strength become large as the size of the ingot is enlarged. The wide variation range of the performance or the mechanical strength in the ingot causes deterioration of reliability or productivity of the thermoelectric semiconductor chip. On the other hand, in the case of the first and the second embodiment, a variation range of the performance and the mechanical strength is small because the ingot is produced by integrating two or more small sintered ingots. Accordingly, the first and the second embodiments are superior to the comparative embodiment in uniformity of the performance and the mechanical strength which relate the reliability and productivity of the thermoelectric semiconductor chip. Therefore, a large thermoelectric semiconductor ingot which has uniform performance and mechanical strength can be produced by way of the first and the second embodiments, so that many wafers can be produced at one time in the slicing step, so as to greatly improve productivity.

In case the plastic deformation temperature is set over 550° C. (not shown in Table 1), it has been found that the sintered ingot is melted in the integrating step, and molten alloy has leaked out from a clearance between the die and the punch, so that the die is damaged.

In case the pressure applied to the sintered ingots in the integrating step is 9.8 MPa (100 kg/cm²) (not shown in Table 1), the test piece crashes when quarrying the sintered ingot. Therefore, the bending strength can not be measured.

As described in the above preferred embodiments, the present invention involves a method for producing a thermoelectric semiconductor comprising an ingot production step for producing an ingot of the thermoelectric semiconductor and an integrating step for integrating a plurality of said ingots by plastic deforming said ingots to produce an integrated ingot of the thermoelectric semiconductor. The large size of the thermoelectric semiconductor ingot having uniform performance and mechanical strength can be produced by integrating two or more ingots. Therefore, many wafers can be produce at one time in the slicing step, and productivity is improved. Further, two or more ingots are integrated by plastic deforming so that the connecting strength of the connecting interface is sufficient.

In the integrating step, the plastic deformation temperature T is preferably selected within the range of 350° C.≦T≦550° C. Further, the plastic deformation time t is selected to be more than 10 minutes. If the integrating step is performed within the conditions described above, the bending strength is sufficient to improve the connecting strength of the contacting interface so that the mechanical strength is improved.

In the sintering step in the first embodiment, the step includes the lower punch pressing portion and the upper punch pressing portion. In the lower punch pressing portion, the powder in the cavity is pressed from below, and in the upper punch pressing portion the powder in the cavity is pressed from above. Therefore, the powder in the cavity is pressed from one side and the other side, and a density in the sintered ingot after sintering is uniform so that a dispersion of the performance in the ingot can be more restrained.

The preferred embodiment of the present invention is explained above. However, the present invention is not limited to the above embodiments. For example, though sintering of the thermoelectric semiconductor is used in the integrating step in the first and second embodiments, the present invention is not limited to a sintered ingot. A crystal body or powdered body of the thermoelectric semiconductor may instead be used. Further, though two or more ingots in the cavity are of the same shape in the first and the second embodiments, ingots which are different in shape may instead be used. Further, though the thermoelectric semiconductor having the composition represented by Bi—Sb—Te, more particularly by $Bi_{0.5}Sb_{1.5}Te_3$, is used in the first and the second embodiments, the present invention is not limited to the above composition. A thermoelectric semiconductor which has a composition having a cleavage plain may also be used. For example, $Bi_2Te_3$, $Bi_2Se_3$, $Sb_2Te_3$, $Sb_2Se_3$, or a composition combining two or more compositions above described may be used.

It is intended that the foregoing detailed description be regarded as illustrative rather than limiting and that it is understood that the following claims including all equivalents are intended to define the scope of the invention.

What is claimed is:

1. A method for producing a thermoelectric semiconductor comprising:
    an ingot production step of producing an ingot of a thermoelectric semiconductor; and
    an integrating step of integrating a plurality of said ingots by deforming said ingots to produce an integrated ingot of the thermoelectric semiconductor.

2. The method for producing a thermoelectric semiconductor as set forth in claim 1, wherein the ingot production step includes a step of sintering the ingot.

3. The method for producing a thermoelectric semiconductor as set forth in claim 1, wherein the ingot production step comprises a sintering step of sintering a crystal alloy powder of the thermoelectric semiconductor.

4. The method for producing a thermoelectric semiconductor as set forth in claim 3, wherein the sintering step comprises:
    a first pressing portion in which the crystal alloy powder is pressed from one direction; and
    a second pressing portion in which the crystal alloy powder is pressed from a direction opposite the one direction.

5. The method for producing a thermoelectric semiconductor as set forth in claim 3, wherein the sintering step comprises hot extruding the crystal alloy powder.

6. The method for producing a thermoelectric semiconductor as set forth in claim 1, wherein the integrating step comprises:
    a first pressing portion in which the ingots are pressed from one direction; and
    a second pressing portion in which the ingots are pressed from a direction opposite the one direction.

7. The method for producing a thermoelectric semiconductor as set forth in claim 1, wherein a temperature in the integrating step is set to the range from 350° C. to 550° C., a pressure in the integrating step is set to more than 19.6 MPa, and a plastic deforming time is set to more than 10 minutes.

8. A method for producing a thermoelectric semiconductor comprising:
    a crystal alloy production step of producing a crystal alloy of a thermoelectric semiconductor material;
    a powdering step of powdering the crystal alloy of the thermoelectric semiconductor material to form a crystal alloy powder;
    a sintering step of sintering the crystal alloy powder to form a sintered ingot;
    an integration step of plastic deforming a plurality of said sintered ingots to integrate said ingots to produce an integrated ingot of the thermoelectric semiconductor.

9. The method for producing a thermoelectric semiconductor as set forth in claim 8, wherein said sintering step is performed by extruding the powder in a sintered condition.

* * * * *